(12) United States Patent
Islam et al.

(10) Patent No.: US 11,004,768 B2
(45) Date of Patent: May 11, 2021

(54) MULTI-CHIP PACKAGE WITH PARTIAL INTEGRATED HEAT SPREADER

(71) Applicant: Intel Corporation, Santa Clara, CA (US)

(72) Inventors: Muhammad S. Islam, Chandler, AZ (US); Enisa Harris, Phoenix, AZ (US); Suzana Prstic, Chandler, AZ (US); Sergio Chan Arguedas, Chandler, AZ (US); Sachin Deshmukh, Chandler, AZ (US); Aravindha Antoniswamy, Phoenix, AZ (US); Elah Bozorg-Grayeli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/529,639

(22) Filed: Aug. 1, 2019

(65) Prior Publication Data

US 2021/0035886 A1    Feb. 4, 2021

(51) Int. Cl.
*H01L 23/42*    (2006.01)
*H01L 23/367*    (2006.01)
*H01L 23/10*    (2006.01)
*H05K 7/20*    (2006.01)
*H01L 23/00*    (2006.01)
(Continued)

(52) U.S. Cl.
CPC .............. *H01L 23/42* (2013.01); *H01L 23/10* (2013.01); *H01L 23/3675* (2013.01); *H01L 24/32* (2013.01); *H01L 25/065* (2013.01); *H05K 7/205* (2013.01); *H05K 7/20445* (2013.01); *H01L 2023/4068* (2013.01); *H01L 2224/32145* (2013.01); *H01L 2924/14* (2013.01)

(58) Field of Classification Search
CPC ..... H01L 23/42; H01L 23/10; H01L 23/3675; H01L 24/32; H01L 2023/4068; H01L 2224/32145; H01L 2924/14; H05K 7/20445
See application file for complete search history.

(56) References Cited

U.S. PATENT DOCUMENTS

| 6,413,353 | B2 * | 7/2002 | Pompeo | ................. | C09J 183/04 |
| | | | | | 156/307.3 |
| 2003/0173051 | A1 * | 9/2003 | Rinella | ................ | B22D 17/007 |
| | | | | | 164/113 |

(Continued)

*Primary Examiner* — Feifei Yeung Lopez
(74) *Attorney, Agent, or Firm* — Green, Howard & Mughal LLP

(57) ABSTRACT

A multi-chip package includes multiple IC die interconnected to a package substrate. An integrated heat spreader (IHS) is located over one or more primary IC die, but is absent from over one or more secondary IC die. Thermal cross-talk between IC dies and/or thermal performance of individual IC dies may be improved by constraining the dimensions of the IHS to be over less than all IC die of the package. A first thermal interface material (TIM) may be between the IHS and the primary IC die, but absent from over the secondary IC die. A second TIM may be between a heat sink and the IHS and also between the heat sink and the secondary IC die. The heat sink may be segmented, or have a non-planarity to accommodate differences in z-height across the IC die and/or as a result of constraining the dimensions of the IHS to be over less than all IC die.

15 Claims, 13 Drawing Sheets

(51) Int. Cl.
*H01L 25/065* (2006.01)
*H01L 23/40* (2006.01)

(56) References Cited

U.S. PATENT DOCUMENTS

| | | | |
|---|---|---|---|
| 2005/0051889 A1* | 3/2005 | Wood | H01L 25/18 257/712 |
| 2006/0039118 A1* | 2/2006 | Jafari | H01L 23/42 361/719 |
| 2014/0151871 A1* | 6/2014 | Refai-Ahmed | H01L 23/49838 257/712 |
| 2014/0197541 A1* | 7/2014 | Stephens | H01L 21/3212 257/772 |
| 2014/0367847 A1* | 12/2014 | Strader | B23P 15/26 257/717 |
| 2017/0186628 A1* | 6/2017 | Antoniswamy | H01L 21/4878 |
| 2017/0221793 A1* | 8/2017 | Smalley | H01L 24/00 |
| 2018/0005991 A1* | 1/2018 | Seidemann | H01L 25/105 |

* cited by examiner

MULTI-CHIP PACKAGE WITH PARTIAL INTEGRATED HEAT SPREADER

BACKGROUND

In electronics manufacturing, integrated circuit (IC) packaging is a stage of semiconductor device fabrication, in which an IC that has been fabricated on a die (or chip) comprising a semiconducting material is enclosed in an "assembly" or "package" that can protect the IC from physical damage and support electrical contacts that connect the IC to a host. Multiple IC die may be packaged together into a single package, often referred to as a multi-chip package.

A heat spreader integrated into a package may help to dissipate thermal load by improving heat transfer from a packaged IC die to an external heat sink. Integration of a heat spreader in multi-chip packages poses additional challenges.

FIG. 1A is a partially exploded isometric illustration of a conventional multi-chip package 100 that includes an integrated heat spreader 40. As shown, a front surface of an IC die 20 is connected to package substrate 30 by first level interconnects (FLI) 22. A front surface other IC die 15 are similarly coupled to substrate 30 by FLI. Substrate 30 may include a number of conductive routing layers (not depicted) interconnecting IC dies 15 and 20. Although four IC die 15 are illustrated, any number of such die may be housed within a multi-chip assembly. In the illustrated example, IC die 20 has a greater z-height, or thickness (e.g., in z-dimension), than IC die 15. The difference between a maximum chip z-height Z1 and a minimum chip z-height Z2 may be 50 µm, or more. Alternatively, IC die 20 may be thinner than IC die 15. Regardless of whether a main die or satellite die is thicker, the single IHS 40 over all die can result in poor thermal performance for the thinner die.

FIG. 1B is a plan view of multi-chip package 100. As shown, IC die 20 has a die length L1 and a die width W2. For the illustrated layout, length L1 is greater than an aggregate length occupied by IC dies 15 such that the multi-chip layout occupies an area of length L1 by an aggregate width exceeding a sum of IC chip widths W1, W2, and W3.

As shown in FIG. 1A and FIG. 1B, an integrated heat spreader (IHS) 40 has a width W and a length L sufficient to cover all chips of the module with an outer edge of IHS 40 comprising sidewalls that are adhered to package substrate 30 so as to fully surround IC die 15 and 20 (outlined in dashed lines).

As further shown in FIG. 1A, a thermal interface material (TIM) portion 10A is between die 20 and IHS 40, with another TIM portion 10B between die 15 and IHS 40. TIM 10 may be a viscous fluid (e.g., a "thermal grease"), or a compressible pad. Within its sidewalls, IHS 40 is a substantially flat sheet such that any difference between IC die z-heights Z1 and Z2 is accommodated by a difference in z-thickness between TIM portions 10A and 10B. For example, TIM portion 10B may have a z-thickness Z4 that is greater than z-thickness Z3 of TIM portion 10A by approximately the same amount by which IC die z-height Z1 is greater than die z-height Z2.

For various reasons, thermal performance of package 100 can be poor, and so alternative multi-chip package assemblies offering better thermal performance would be commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1A:
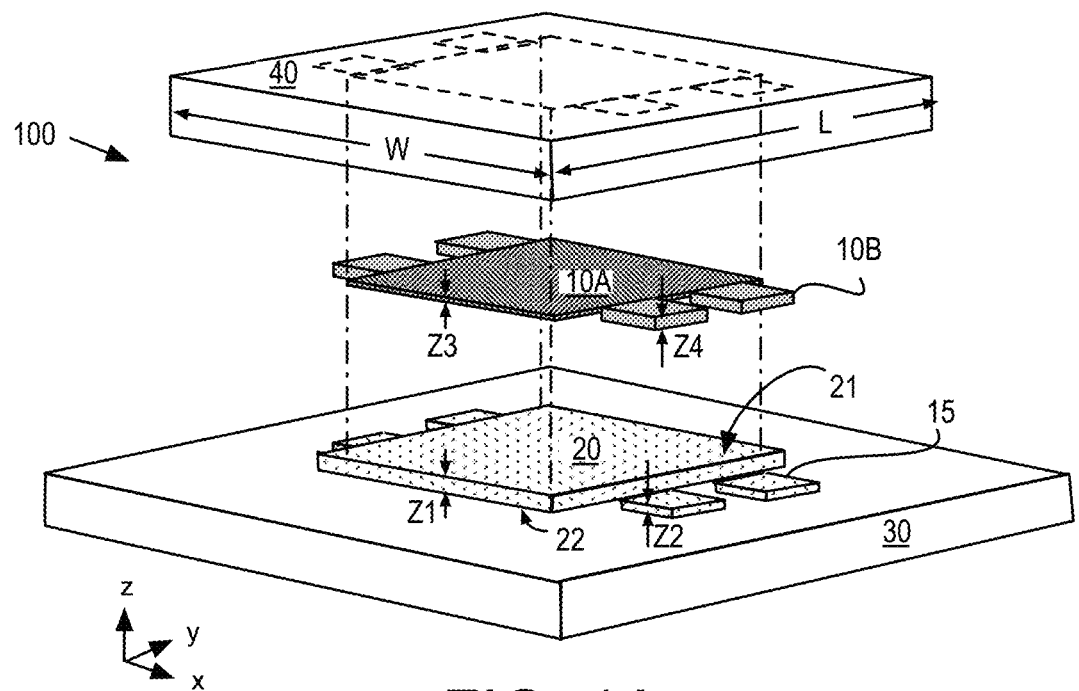
FIG. 1A illustrates a partially exploded isometric view of a conventional multi-chip package including an IHS over the IC die.
Figure 1B:
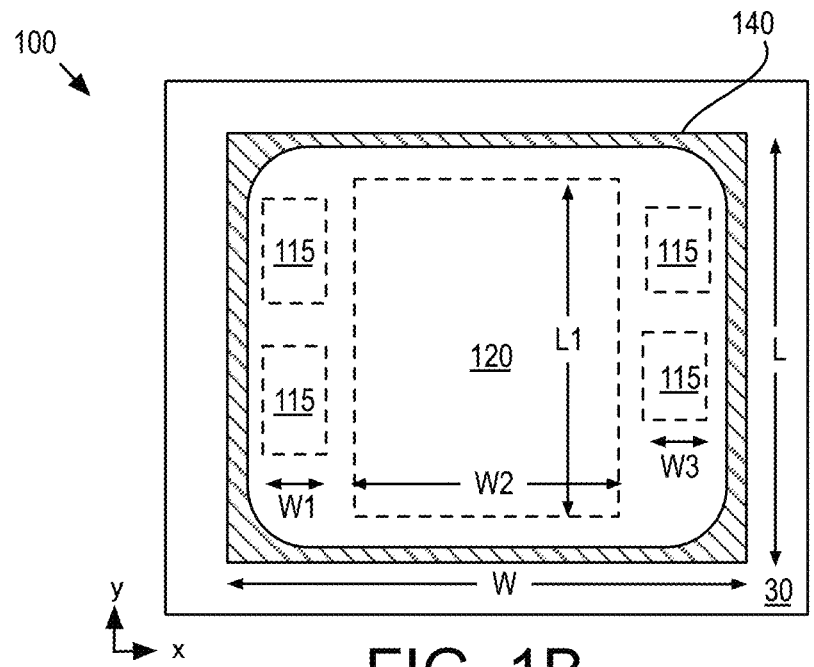
FIG. 1B illustrates a plan view of the conventional multi-chip package shown in FIG. 1A.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Embodiments of a multi-chip package including a partial integrated heat spreader are described herein. The inventors have determined that the use of an IHS that covers all IC die within a multi-chip package can pose thermal problems for thinner die when combined with thicker die. For example, a thinner IC die within a multi-chip package may fail thermal targets because of thermal resistance associated with a greater thickness of TIM between the die and IHS. The inventors have also found that an IHS can increase thermal crosstalk between adjacent die, which may be detrimental to the thermal performance of some die within a multi-chip package. For example, heat laterally conducted by the IHS from a die dissipating more power may heat an adjacent die that is dissipating less power. As further described below, integration of a partial heat spreader within a multi-chip package may mitigate both of these issues and/or otherwise improve thermal performance of the package.

In accordance with some embodiments, a multi-chip package includes a partial IHS that does not overlay all IC die of the package, but rather is located over only a subset of the die for which the IHS is most beneficial. Rather than being dimensioned to span an area of all IC die in aggregate, a partial IHS is dimensioned to be over only one, or perhaps only a few, of the IC die within a multi-chip package. Die of differing height and/or differing power dissipation levels may be excluded from the region occupied, or overlapped, by a partial IHS. As described further below, a partial IHS may have limited lateral dimensions, or have one or more windows that expose one or more IC dies. In some such embodiments, a TIM that is between a partial IHS and a heat sink may be further located between the heat sink and an IC die excluded from a partial IHS, eliminating a TIM layer and also the IHS from the thermal conduction path between the excluded IC die and the heat sink.

Figure 2A:
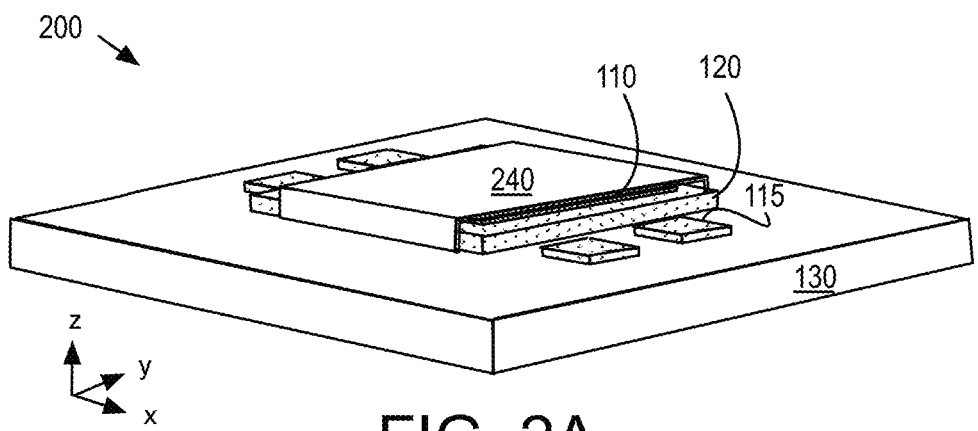
FIG. 2A illustrates a isometric view of a multi-chip package including a partial IHS over less than all IC die, in accordance with some embodiments.
Figure 2B:
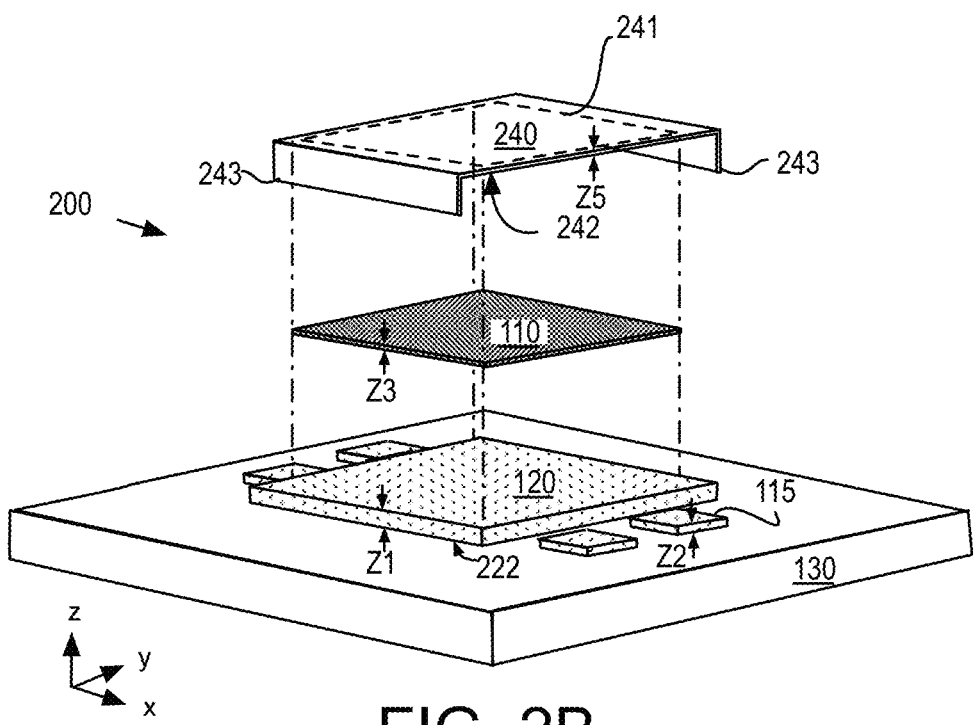
FIG. 2B illustrates a partially exploded isometric view of a multi-chip package shown in FIG. 2A, in accordance with some embodiments.
Figure 2C:
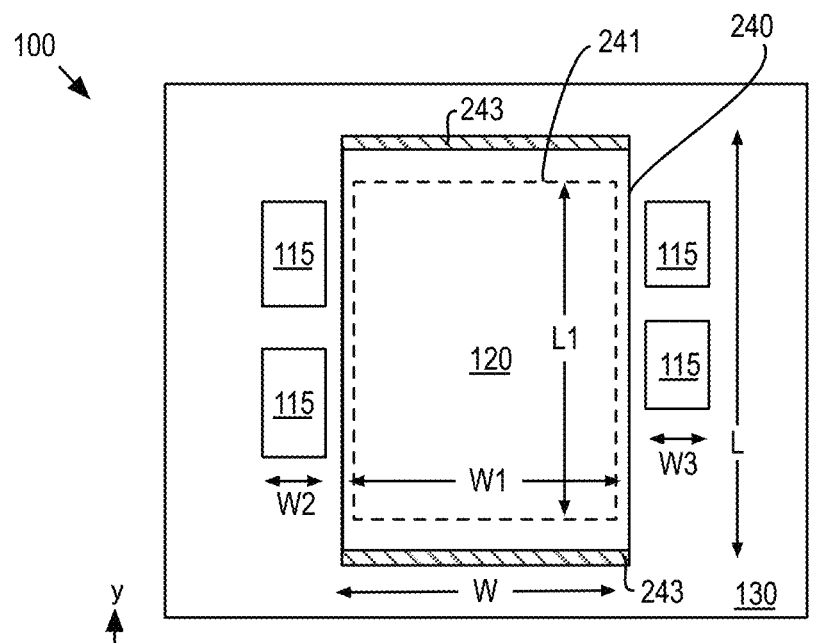
FIG. 2C illustrates a plan view of the multi-chip package shown in FIG. 2A, in accordance with some embodiments.

FIG. 2A illustrates an isometric view of a multi-chip package 200 including a partial IHS 240 that is located over fewer than all packaged IC die, in accordance with some embodiments. FIG. 2B illustrates a partially exploded isometric view of multi-chip package 200, in accordance with some embodiments. FIG. 2C illustrates a plan view of the multi-chip package 200, in accordance with some embodiments.

As shown in FIG. 2A and FIG. 2B, a primary IC die 120 is electrically coupled to package substrate 130. Package substrate 130 may be any substrate suitable for interconnecting multiple die within a package. Package substrate 130 may include one or more metallization levels for routing signals between any IC die that are interconnected to package substrate 130. IC die 120 is electrically connected to substrate 130 by conductive FLI 222. FLI 222 may be any known to be suitable for electrically coupling an IC die to a substrate, such as, but not limited to, solder features (e.g., solder balls, solder bumps, microbumps, pillars, etc.), or direct bonding (e.g., copper-to-copper bonding, etc.). Secondary (satellite) IC die 115 are also electrically connected to substrate 230 by conductive FLI 222. Substrate 130 may include one or more levels of interconnect metallization (not depicted) that electrically interconnect IC die 115 and 120.

Primary IC die 120 may include one or more integrated circuits, such as, but not limited to, power management ICs (PMICs), radio frequency communication ICs (RFICs), microprocessors (e.g., application processors, central processors, graphics processors), or memory ICs (e.g., DRAM). Satellite die 115 may also include one or more integrated circuits, such as, but not limited to, PMICs, RFICs, microprocessors, or memory ICs. In accordance with some embodiments, primary IC die 120 places a higher thermal load on package 200 than does any one satellite IC die 115. For example, primary IC die 120 may have a higher peak power dissipation than that of any of satellite die 115. In the illustrated example, only one primary IC die 220 is illustrated. However, a multi-chip package may instead include two or more IC die that place similar heat loads on a package. For example, two primary IC die that on average dissipate substantially the same power may be interconnected to substrate 230. Hence, primary IC die may include two or more IC die, which may have substantially identical circuitry that has been replicated within a multi-chip package.

As shown in FIG. 2C, primary IC die 120 has a footprint 241 equal to die length L1 by die width W1. Footprint 241 may occupy any area. For example, footprint 241 may be a few square millimeters to around 1000 $mm^2$. Each satellite die 115 is associated with a similar footprint that may occupy a package substrate area in the same range of 2 $mm^2$-1000 $mm^2$, for example.

As further illustrated in FIG. 2B, primary IC die 120 has a die z-height, or z-thickness, Z1. Satellite die 115 have a die z-height, or z-thickness, Z2. Although multiple satellite die 115 are illustrated to have substantially the same die z-height Z2, z-height may further differ across the various satellite die 215. In some examples, die z-height Z1 is at least 40 μm larger than die z-height Z2, and may be 400 μm larger, or more. Although FIG. 2B illustrates the more common situation where thickness of an IC die scales with footprint of the die, an IC die of smaller footprint may also have greater thickness than an IC die of larger footprint. In one specific embodiment, a high voltage IC die of smaller footprint may have a greater thickness than a low voltage IC die of larger footprint. Hence, in some alternative examples, die z-height Z1 is at least 40 μm less than die z-height Z2.

In package 200, partial IHS 240 is referred to herein as a "partial" heat spreader for at least the reason that it is located only over primary IC die, and does not also extend over adjacent satellite IC die. As shown in FIG. 2C, partial IHS 240 has an area of length L by width W and a thickness Z4. Length L is approximately equal to primary die length L1, and width W is approximately equal to primary die width W1. Width W, being less than a sum of die widths W1, W2 and W3, is insufficient to cover all die within package 200. IHS 240 is approximately aligned with primary IC chip 120, and all satellite IC die 115 are left exposed, or uncovered by IHS 240. The IC die thickness of Z1 summed with TIM 10A thickness Z3 and partial IHS thickness Z5 is greater than satellite IC die thickness Z2.

Rather than forming a perimeter around all sides of a multi-chip IC die layout, IHS 240 instead includes only two legs 243 where IHS 240 has a bend (e.g., approximately 90°) from an x-y plane substantially parallel to a plane of substrate 130 to intersect substrate 130 at points adjacent to two opposite sidewalls of primary IC die 120. Legs 243 are adjacent to two opposing sidewalls of primary IC die 120 where there are no satellite IC die 115. Legs 243 contact substrate 130 over two lengths that are approximately equal W2 where there is no interference with satellite IC die 115. Such IHS-to-substrate contact may be advantageous for reducing package warp, for example. Hence, although partial IHS 240 does not occupy an area sufficient to contact substrate 130 along a perimeter surrounding all IC die, planarity and/or stiffness of multi-chip package 200 may nevertheless be improved through contact between one or more points of contact between substrate 130 and partial IHS 240. Legs 243 may be affixed to substrate 230, for example with an adhesive sealant (not depicted).

Partial IHS 240 may be of one or more materials having adequate thermal conductivity, and may have any thickness suitable to provide sufficient package rigidity and/or protection to the underlying IC die 120 and/or TIM 110. Dashed line 241 demarks an interior region of IHS 240 that is in contact with TIM 110. Partial IHS 240 may be, for example, a stamped sheet good, such as a plated metal that has been formed into a lid having the predetermined dimensions (L)×(H). Partial IHS 240 may comprise, for example, a bulk material and a finish material that is over the bulk material. The bulk material may have a greater thickness while the finish material may have a thickness of only a few microns, for example. The finish material may also have a relatively high RMS roughness value as a result of the finishing process (e.g., electrolytic or electroless plating). In one example, the bulk material comprises at least Cu, and may advantageously be an alloy thereof (e.g., that is predominantly Cu). The finish material may comprise one or more thermally conductive materials suitable for passivating the bulk material, such as a metal (elemental or alloy) that resists oxidation. Where bulk material comprises Cu, for example, finish material comprises other than Cu, and in some examples comprises Ni (e.g., predominantly Ni).

As further illustrated in FIG. 2A and FIG. 2B, TIM 110 is likewise confined to an area substantially over primary IC die 120. There is no portion of TIM 110 over satellite die 115. Therefore, TIM 110 need only accommodate z-height Z1, and have only one target bond line thickness (BLT) Z3 that can be optimized for heat transfer between IC die 120 and partial IHS 240. For example, BLT Z3 may be minimized to be just sufficient for accommodating irregularities or non-planarity in primary IC die 120 and/or IHS 240. In some examples, BLT Z3 is less than 100 μm, may be less than 50 μm, and may even be less than 25 μm. In the illustrated example, TIM 110 is in direct contact with an interior top surface 242 of partial IHS 240. In other embodiments however, one or more intervening materials may be between TIM 110 and partial IHS 240, and/or between TIM 110 and primary IC die 120.

TIM 110 may advantageously have a relatively low bulk modulus that, when coupled with a sufficient BLT Z3, enables TIM 110 to compress under load, accommodate irregularities, and maximize the area of physical contact between IHS 240 and IC die 120. Material TIM 110 may have a variety of compositions. In some embodiments, TIM 110 is a composite comprising one or more fillers in a matrix. In some specific embodiments, the filler comprises a graphitic material (e.g., crystalline graphite, pyrolytic graphite). Graphitic material may be in any form, such as a stack of 2D sheets oriented either to be parallel to material thickness Z3, orthogonal to material thickness Z3, or non-parallel/non-orthogonal material thickness Z3. For some embodiments, the matrix material is a polymer. While many polymers may be suitable, some examples include silicone-based polymers (i.e., polysiloxanes comprising silicon, oxygen, carbon), synthetic rubbers, and natural rubber.

Figure 3A:
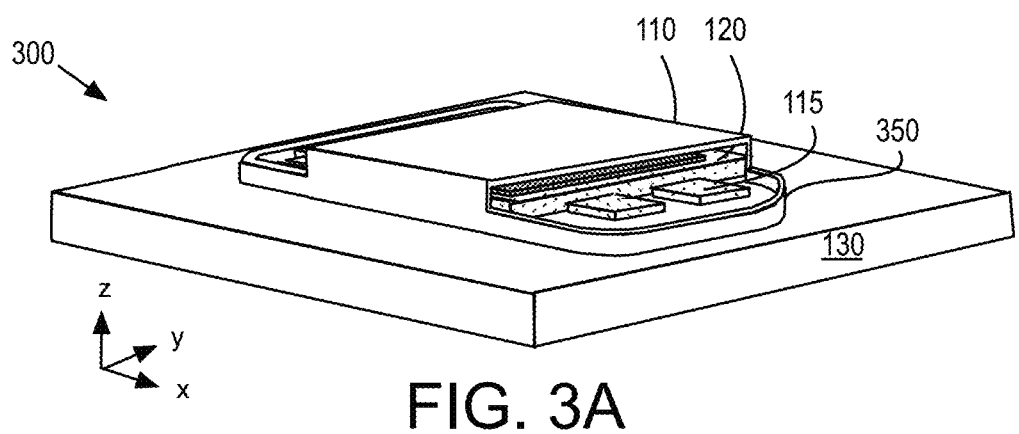
FIG. 3A illustrates an isometric view of a multi-chip package including a partial IHS over less than all IC die, in accordance with some embodiments.
Figure 3B:
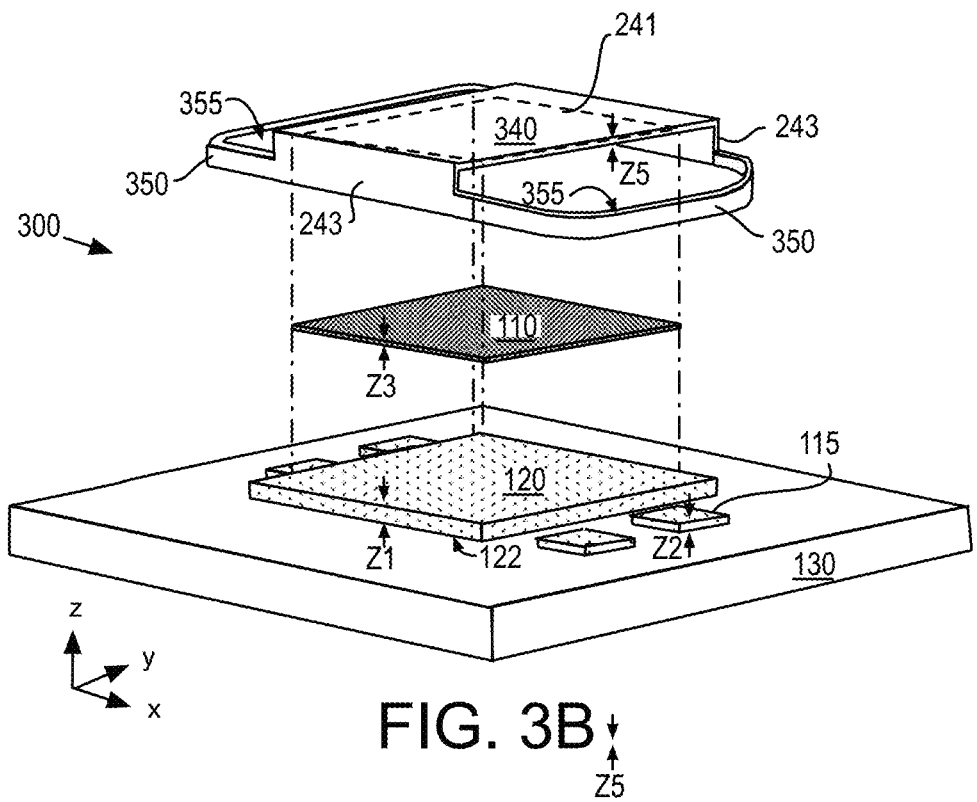
FIG. 3B illustrates a partially exploded isometric view of the multi-chip package shown in FIG. 3A, in accordance with some embodiments.
Figure 3C:
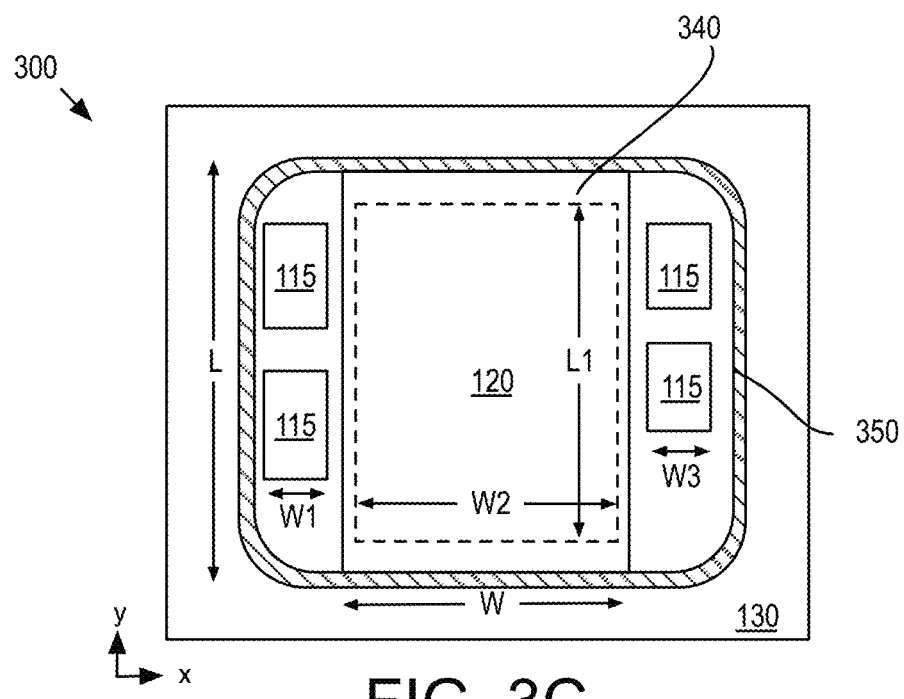
FIG. 3C illustrates a plan view of the multi-chip package shown in FIG. 3A, in accordance with some embodiments.

FIG. 3A illustrates an isometric view of a multi-chip package 300 including a partial IHS 340 that is over less than all IC die, in accordance with some embodiments. FIG. 3B illustrates a partially exploded isometric view of a multi-chip package 300, in accordance with some embodiments. FIG. 3C illustrates a plan view of the multi-chip package 300, in accordance with some embodiments. In multi-chip package 300, reference numbers are retained where a component or feature share attributes with a corresponding component or feature of multi-chip package 200 (FIG. 2A).

Multi-chip package 300 includes primary IC die 120 and satellite die 115 coupled to package substrate 130 substantially as described above for multi-chip package 200. As shown in FIG. 3A and FIG. 3B, TIM 110 is again confined to a space between primary IC die 120 and an interior top surface of a partial IHS 340. Partial IHS 340 includes an interior portion having an area approximately equal to (or slightly larger than) primary IC die 120 that has a die length L1 and a die width W2. This interior portion includes a pair of legs 243 where IHS has a bend (e.g., approximately 90°) from a surface substantially planar to a plane of substrate 130 to contact substrate 130. Legs 243 contact substrate 130 at points adjacent to opposite sidewalls of primary IC die 120. As further illustrated in FIG. 3A-3C, IHS 340 includes a frame 350 that is coupled to IHS legs 243. Frame 350 interconnects legs 243 to each other and encircles one or more satellite IC die 115. Frame 350 may be affixed to substrate 230, for example with an adhesive sealant (not depicted). As shown in FIG. 3B, frame 350 defines a window 355 within which one or more satellite IC die 115 may reside so that they remain uncovered by partial IHS 340. Frame 350 may increase the stiffness of partial IHS 340. In the example illustrated, frame 350 includes two frame members, each member encircling or surrounding a satellite IC die 115 on one side of primary IC die 120.

In the exemplary embodiment illustrated, frame 350 has the same composition as the interior portion over primary IC die 120. For example, partial IHS 340 may all be part of a contiguous sheet good that has been stamped and/or punched to open windows 355 while retaining frame 350. As further illustrated in FIG. 3B, frame 350 has a z-height Z6 that may be more less than satellite IC die z-height Z2, depending, for example on the rigidity of the frame material and stiffness desired. For such embodiments, a second TIM material (not depicted) may be compressed between a top surface satellite IC die 115 and a heat sink (not depicted) without interference from frame 350. A heat sink may therefore make thermal contact to satellite IC die 115 through only the second TIM.

As shown in FIG. 3C, partial IHS 340 makes contact with substrate 130 around a perimeter of all IC die in multi-chip package 300. However, windows 355 leave a surface of one or more satellite die 115 exposed. Any differences between IC die z-height Z1 and IC die z-height Z2 therefore do not impact partial IHS 340. Partial IHS 340 may also limit thermal cross-talk between primary IC die 120 and satellite IC die 115, which are excluded from partial IHS 340.

Figure 4A:
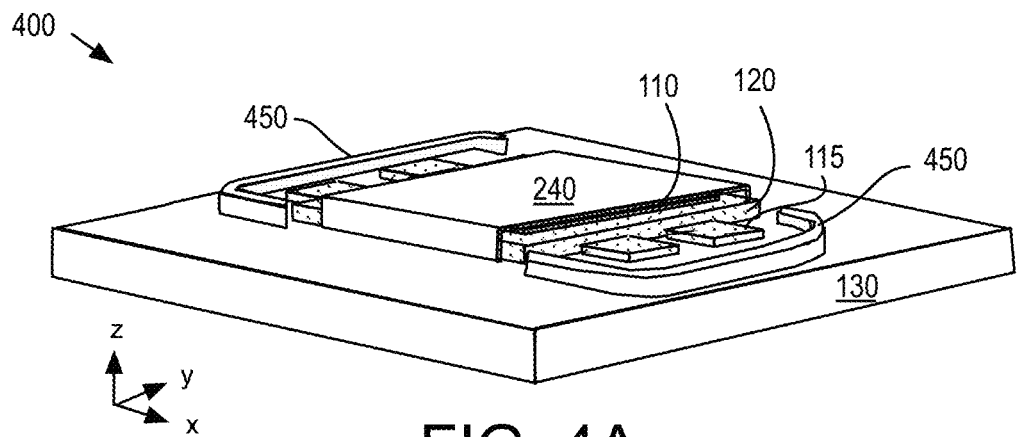
FIG. 4A illustrates an isometric view of a multi-chip package including a partial IHS over less than all IC die, in accordance with some embodiments.
Figure 4B:
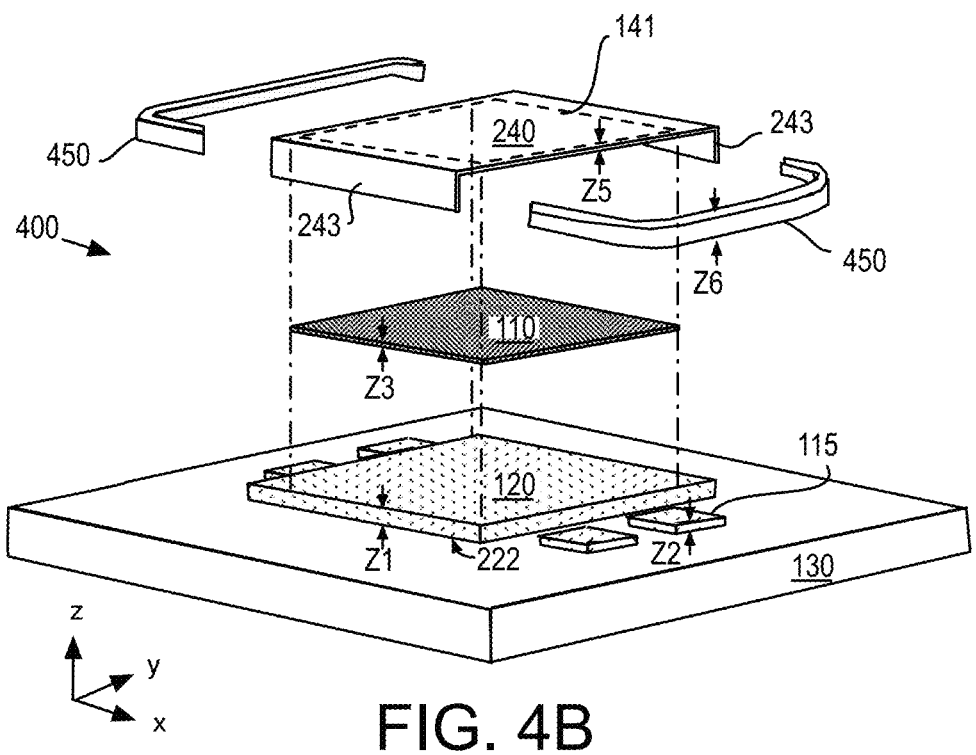
FIG. 4B illustrates a partially exploded isometric view of the multi-chip package illustrated in FIG. 4A, in accordance with some embodiments.
Figure 4C:
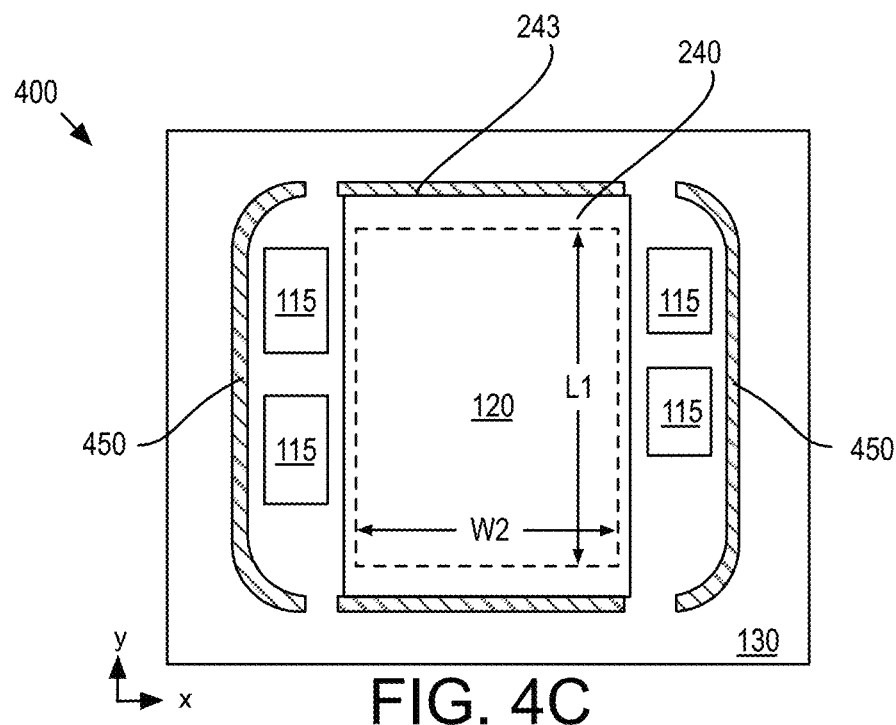
FIG. 4C illustrates a plan view of the multi-chip package shown in FIG. 4A, in accordance with some embodiments.

FIG. 4A illustrates an isometric view of a multi-chip package 400 including a partial IHS 240 that is over less than all IC die, in accordance with some embodiments. FIG. 4B illustrates a partially exploded isometric view of a multi-chip package 400, in accordance with some embodiments. FIG. 4C illustrates a plan view of the multi-chip package 400, in accordance with some embodiments. In multi-chip package 400, reference numbers are retained where a component or feature share attributes with a corresponding component or feature of multi-chip package 200 (FIG. 2A).

Multi-chip package 400 includes primary IC die 120 and satellite die 115 coupled to package substrate 130 substantially as described above for multi-chip package 200. As shown in FIG. 4A-4C, partial IHS 240 introduced in the context of FIG. 2A-2C is supplemented with one or more mechanical stiffeners 450. Although functionally similar to frame 350 of multi-chip package 300 (FIG. 3A-3C), stiffeners 450 are discrete components separate from partial IHS 240. As separate components, stiffeners 450 may have any suitable composition (e.g., of a different material than partial IHS 240). Stiffeners 450 may, for example, comprise a metal, a glass, a plastic, an epoxy resin, or other material known to be suitable as a package substrate stiffening member. Stiffeners 450 may have any geometry and dimensions suitable for supplementing partial IHS 240 in a manner that reduces warp of package 400 to some threshold level (e.g., at or below that of a multi-chip package having a complete IHS).

As further illustrated in FIG. 4B, stiffener 450 has a z-height Z6 that may be greater than or less than satellite IC die z-height Z2 depending on the modulus of the stiffener material and desired stiffness to be imparted to package 400. For some embodiments, a second TIM material (not depicted) may be compressed between a top surface satellite IC die 115 and a heat sink (not depicted) without interference from stiffener 450. The heat sink may therefore make thermal contact to satellite IC die 115 through only the second TIM.

As shown in FIG. 4C, partial IHS 240 makes contact with substrate 130 only at legs 243 while one or more satellite IC die 115 are located between partial IHS 240 and individual ones of stiffeners 450. Each stiffener 450 may be affixed to substrate 230, for example with an adhesive sealant (not depicted). Although in the illustrated embodiment stiffeners 450 are not directly coupled to partial IHS 240, in other embodiments stiffeners 450 are affixed to partial IHS 240, for example with an adhesive between legs 243 and end lengths of stiffeners 450 that may overlap legs 243.

In the illustrated example, each of two stiffeners 450 at opposite sides of package 400 have a longitudinal length exceeding primary IC die length L1. Stiffeners 450 therefore have a length, when added to two W2 lengths of legs 243, which is nearly equal to a perimeter length of a complete IHS that might cover all IC die 120, 115. Individual ones of stiffeners 450 define a semi-circle about two satellite IC die 115. Stiffeners 450 have a transverse width significantly smaller than the longitudinal length, for example to substantially emulate the contact area of IHS that completely covers all satellite IC die 115. In other embodiments however, stiffeners 450 may have any transverse width and longitudinal length required for a stiffener with a desired stiffener z-height Z5 to achieve some threshold package stiffness.

Figure 5A:
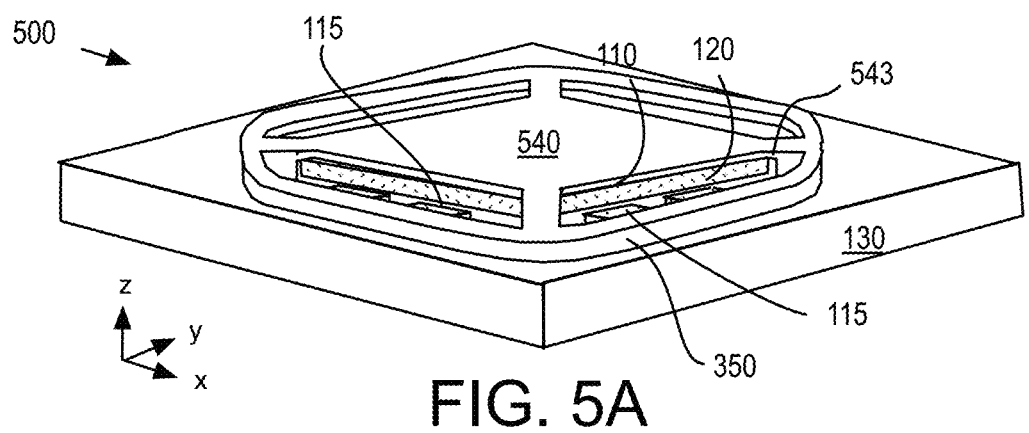
FIG. 5A illustrates an isometric view of a multi-chip package including a partial IHS over less than all IC die, in accordance with some embodiments.
Figure 5B:
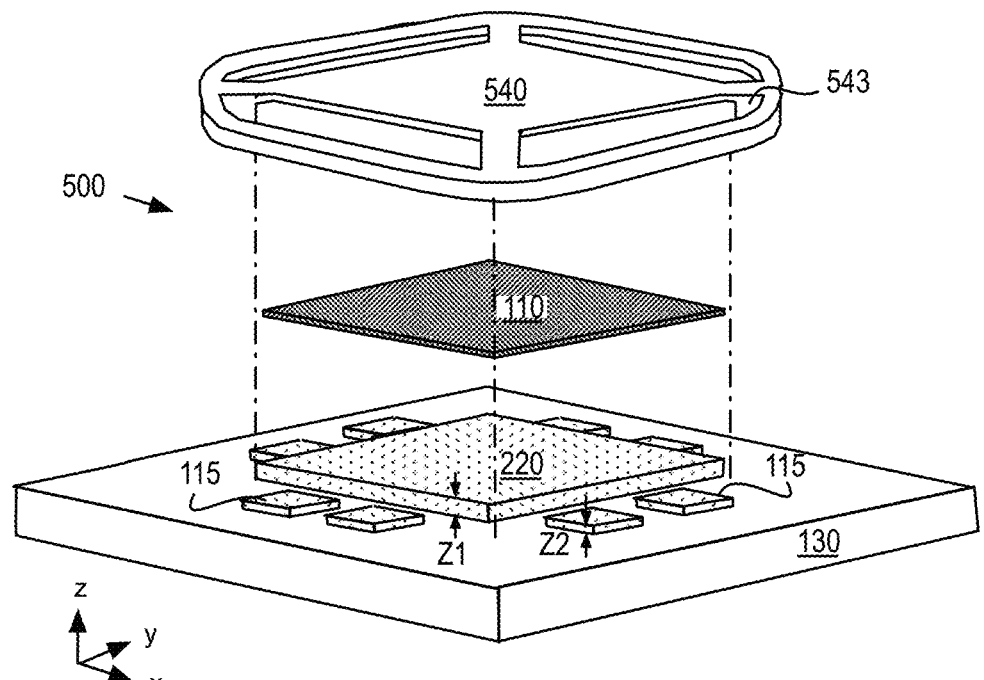
FIG. 5B illustrates a partially exploded isometric view of the multi-chip package shown in FIG. 5A, in accordance with some embodiments.
Figure 5C:
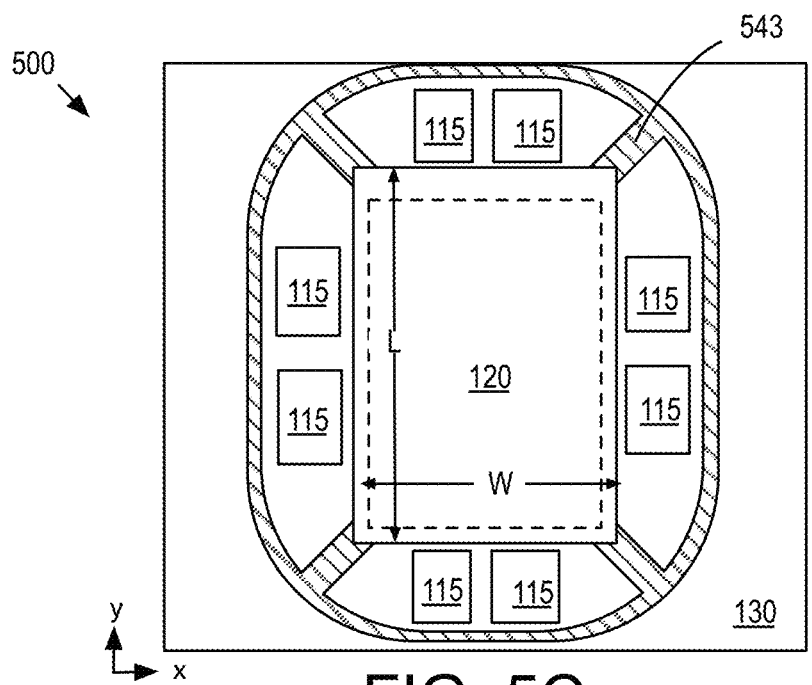
FIG. 5C illustrates a plan view of the multi-chip package shown in FIG. 5A, in accordance with some embodiments.

FIG. 5A illustrates an isometric view of a multi-chip package 500 including a partial IHS 540 that is over less than all IC die, in accordance with some embodiments. FIG. 5B illustrates a partially exploded isometric view of a multi-chip package 500, in accordance with some embodiments. FIG. 5C illustrates a plan view of the multi-chip package 500, in accordance with some embodiments. In multi-chip package 500, reference numbers are retained where a component or feature share attributes with a corresponding component or feature of multi-chip package 200 (FIG. 2A).

Multi-chip package 500 includes satellite IC die 115 adjacent to three or more (e.g., all four) sidewalls of primary IC die 120. IHS 540 includes four legs 543 located at corners of primary IC die 120 where satellite IC die 115 does not interfere with contact between IHS 540 and substrate 130. Legs 543 are joined by frame 350 at a perimeter beyond satellite IC die 115. Legs 543 may impart stiffness to a package assembly. As shown in FIGS. 5B and 5C, satellite IC die 115 may completely surround primary IC die 120 and remain exposed such that partial IHS 540 (or TIM 110) need not accommodate different IC die z-heights (e.g., Z1 and Z2), and need not increase thermal cross-talk between primary IC die 120 and satellite IC die 115.

Notably, various components of the multi-chip packages described above may be combined where not mutually exclusive. For example, the stiffeners 450 in multi-chip package 400 (FIG. 4A) may be similarly applied to multi-chip package 500 (FIG. 5A) instead of, or in combination with frame 350. In such embodiments, a pair of stiffeners 450 may be applied to opposite sides of multi-chip package 500, or four stiffeners 450 may be applied to all four sides of multi-chip package 500.

The multi-chip packages described above may be further assembled with a multi-chip package heat sink. FIGS. 6A, 6B, 6C, and 6D illustrate partially exploded isometric views of multi-chip package assemblies that include a heat sink and a multi-chip package having a partial heat spreader, in accordance with some embodiments. The multi-chip package assemblies illustrate how at least one of a heat sink or a second TIM between the multi-chip package and a heat sink may have a thickness variation that is complementary to a variation in z-height between a partial IHS and the back side of a satellite IC die. This complementary thickness variation may accommodate or neutralize differences in stack-up heights between primary and satellite regions of a multi-chip layout to provide a planar surface on a top side of a multi-chip package assembly.

Figure 6A:
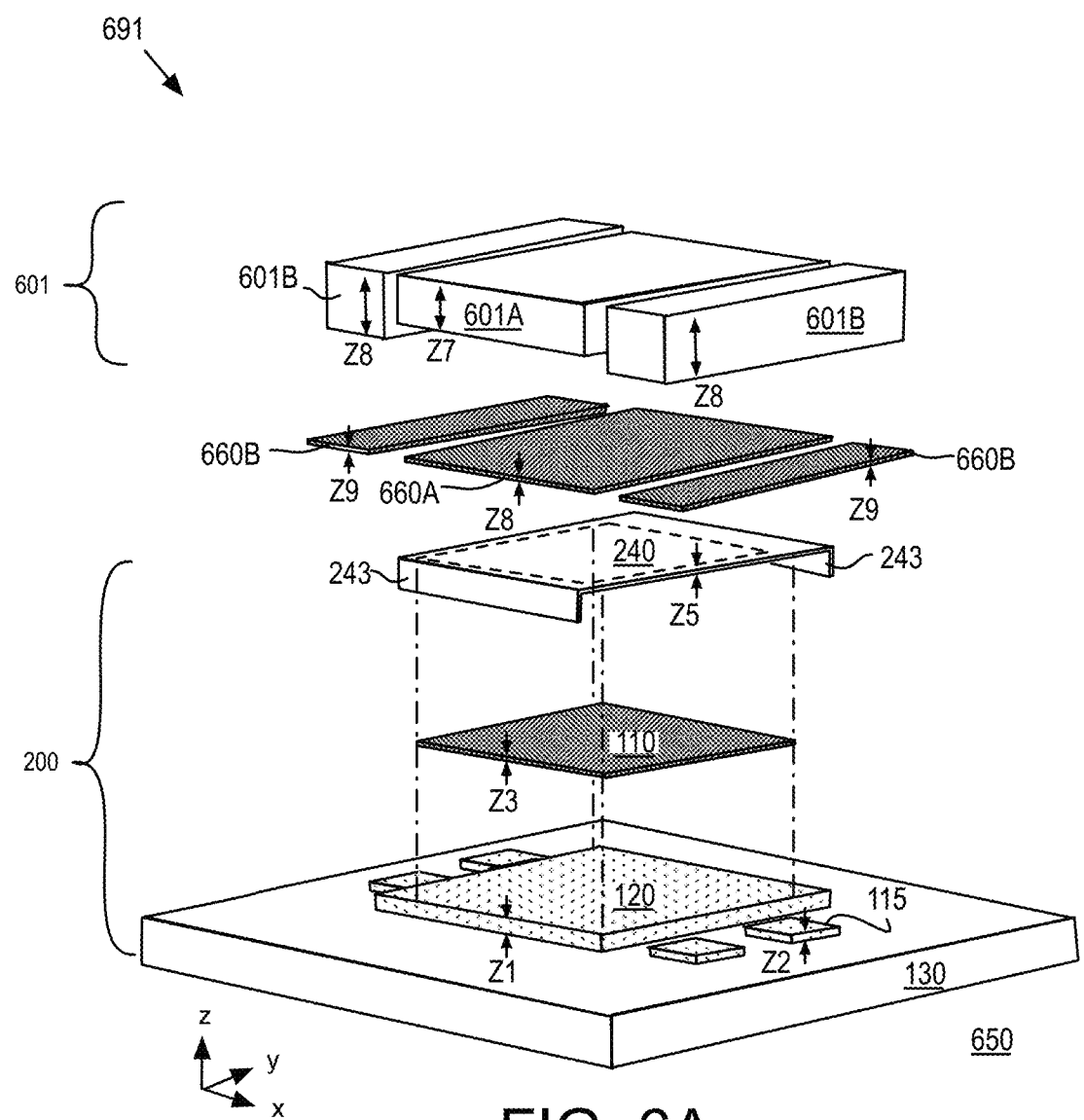
FIGS. 6A, 6B, 6C, and 6D illustrate partially exploded isometric views of multi-chip package assemblies that include a heat sink and a multi-chip package having a partial heat spreader, in accordance with some embodiments.

Referring first to FIG. 6A, multi-chip package assembly 691 includes multi-chip package 200, substantially as described elsewhere herein. In alternative embodiments, assembly 691 may include a different multi-chip package, such as, but not limited to, multi-chip package 300 (FIG. 3A), 400 (FIG. 4A), or 500 (FIG. 5A). Multi-chip package assembly 691 may be attached to any host, such as a printed circuit board (PCB) 650, for example through interconnects (e.g., solder features) between a bottom side of package substrate 130 and the multi-chip package assembly host.

In the example shown in FIG. 6A, assembly 691 further includes a TIM 660 between a split or segmented heat sink 601 and multi-chip package 200. Split heat sink 601 includes two or more discrete heat sink elements that may independently couple to partial IHS 240, and to one or more satellite IC die 115 excluded from partial IHS 240. In assembly 691, split heat sink 601 includes a heat sink element 601A and a heat sink element 601B. Heat sink element 601A has a footprint dimensioned to overlay only partial IHS 240. Heat sink element 601B has footprint dimensions to overlay only satellite IC die 115. In some embodiments, the heat sink elements 601A and 601B have different z-heights so that their top surfaces, opposite package substrate 130, are substantially coplanar when a bottom surface of heat sink elements 601A and 601B are positioned a substantially equal distance (e.g., in the z-dimension) from partial IHS 240 and satellite IC die 115, respectively.

In the example illustrated in FIG. 6A, TIM 660 comprises multiple thermal pads or preforms that are segmented substantially in the same manner as heat sink 601. A first TIM 660A is between heat sink element 601A and partial IHS 240 while a second TIM 660B is between satellite IC die 115 and heat sink element 601B. In exemplary embodiments, TIM 660A is in direct contact with partial IHS 240 and in direct contact with heat sink element 601A. TIM 660B may similarly be in direct contact with a surface of one or more satellite IC die 115 (since TIM 110 and IHS 240 are only over primary IC die 120), and in direct contact with heat sink element 601B. Although segmented as a preform in the illustrated embodiment, TIM 660A, 660B may alternatively be a viscous film layer that is substantially continuous over both IHS 240 and one or more satellite IC die 115. TIM 660A may have a substantially uniform BLT Z9 that is approximately equal to a substantially uniform BLT Z10 of TIM 660B. TIM 660A, 660B may be any material suitable as a thermal interface material between a heat sink and an IHS or an IC die. Although TIM 660A, 660B may be substantially the same as TIM 110, in some embodiments, TIM 660A, 660B is a different material than TIM 110.

As shown in FIG. 6A, heat sink element 601A is associated with a first z-thickness Z7 that is less than a second z-thickness Z8 associated with heat sink element 601B. The difference between z-thickness Z7 and Z8 may be, for example, substantially equal to a difference in z-height between primary IC die 120 and satellite IC die 115 (i.e. z-height Z1–z-height Z2) summed with a z-thickness of TIM 110 (z-height Z3), and summed with a z-thickness of partial IHS 240 (z-height Z5). For such embodiments, TIM 660A, 660B may have BLT Z8 while top surfaces of heat sink elements 601A and 601B are substantially coplanar. Even for embodiments with primary IC die 120 and satellite IC die 115 have the same z-heights, the absence of partial IHS 240 (and any TIM 110 therebetween) may induce a z-height difference in a multi-chip package that may be accommodated by a segmented heat sink to achieve a planar assembly top surface.

Figure 6B:
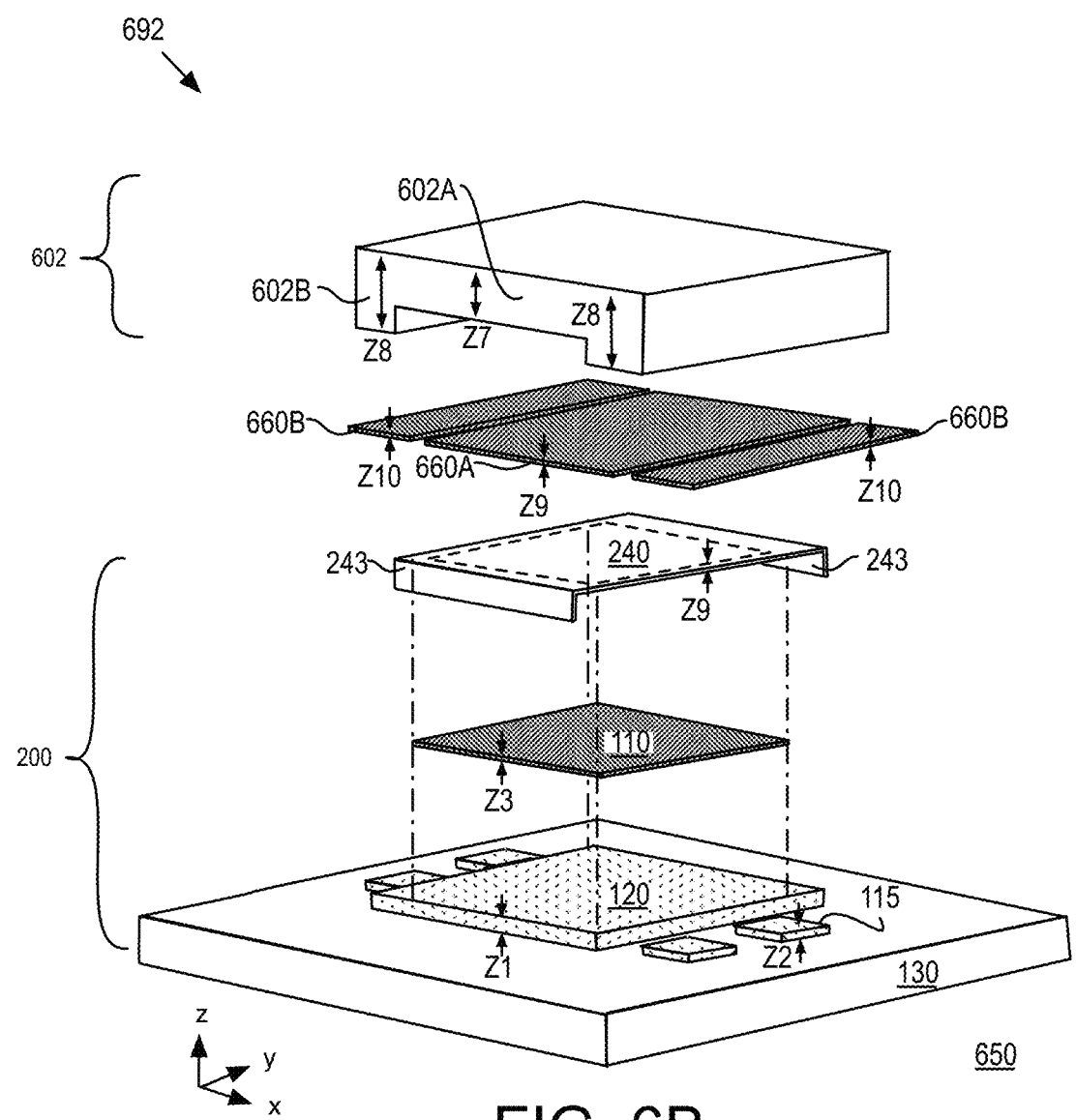

FIG. 6B illustrates a multi-chip package assembly 692 that includes multi-chip package 200, substantially as described elsewhere herein. In alternative embodiments, assembly 692 may include a different multi-chip package, such as, but not limited to, multi-chip package 300 (FIG. 3A), 400 (FIG. 4A), or 500 (FIG. 5A). In the example shown in FIG. 6B, assembly 692 further includes TIM 660A, 660B between a pedestal heat sink 602 and multi-chip package 200. Multi-chip package assembly 692 may be attached to any host, such as a printed circuit board (PCB) 650, for example through interconnects (e.g., solder features) between a bottom side of package substrate 130 and the multi-chip package assembly host.

Pedestal heat sink 602 includes a first region 602A to thermally couple to partial IHS 240, and a second region 602B to thermally couple to one or more satellite IC die 115. Although heat sink 602 is a unitary body, contiguous heat sink portions 602A and 602B have footprints sized to overlay only one of IHS 240 or a satellite IC die 115, respectively. In some embodiments, heat sink portions 602A, 602B have different z-heights so that a bottom surface of the heat sink portions can be at a substantially equal distance (e.g., z-dimension) from both a partial IHS and an IC die excluded from the partial IHS. For example, heat sink portion 602A has a z-thickness Z7 while heat sink portion 602B has a z-thickness Z8. The difference between z-thicknesses Z7 and Z8 may be, for example, substantially equal to a difference in z-height between primary IC die 120 and satellite IC die 115 (i.e. z-height Z1–z-height Z2) summed with a z-thickness of TIM 110 (z-height Z3), and summed with a z-thickness of partial IHS 240 (z-height Z5).

In the example shown in FIG. 6B, TIM 660A is in direct contact with partial IHS 240 and in direct contact with heat sink element 601A. TIM 660B may similarly be in direct contact with a surface of one or more satellite IC die 115 (since TIM 110 and IHS 240 are only over primary IC die 120), and in direct contact with heat sink element 601B. For pedestal heat sink embodiments, TIM 660A may again have BLT Z9 that is equal to BLT Z10 for TIM 660B. Even for embodiments with primary IC die 120 and satellite IC die 115 have the same z-heights, the absence of partial IHS 240 (and any TIM 110 therebetween) may induce a z-height difference in a multi-chip package that may be accommodated by a pedestal heat sink.

Figure 6C:
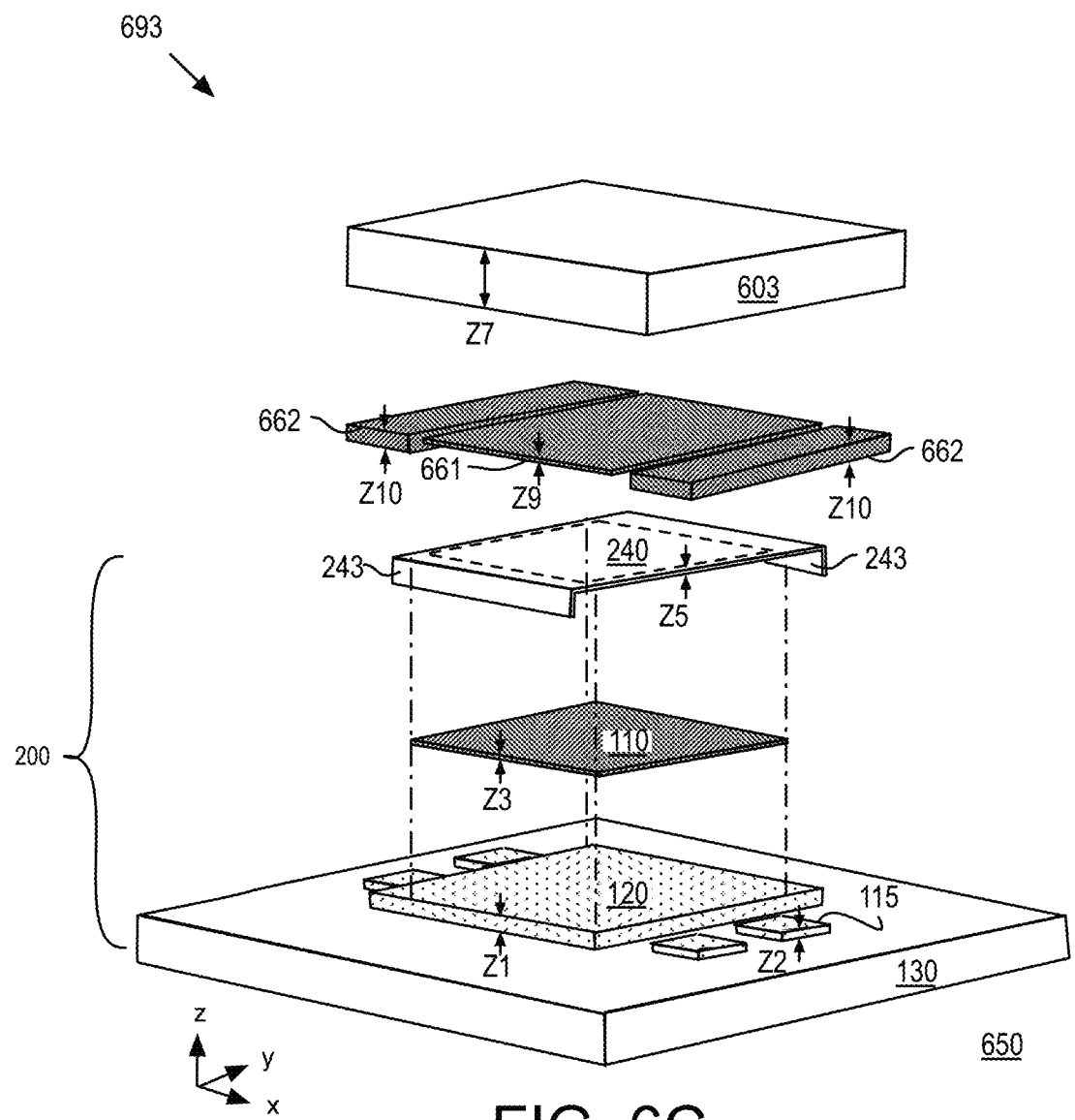

FIG. 6C illustrates a multi-chip package assembly 693 that includes multi-chip package 200, substantially as described elsewhere herein. In alternative embodiments, assembly 693 may include a different multi-chip package, such as, but not limited to, multi-chip package 300 (FIG. 3A), 400 (FIG. 4A), or 500 (FIG. 5A). In the example shown in FIG. 6C, assembly 693 further includes a TIM 661 of a first thickness between a planar heat sink 603 and partial IHS 240. A TIM 662 of a second, greater thickness is between planar heat sink 603 and satellite IC die 115. Multi-chip package assembly 693 may be attached to any host, such as a printed circuit board (PCB) 650, for example through interconnects (e.g., solder features) between a bottom side of package substrate 130 and the multi-chip package assembly host.

Planar heat sink 603 has only a single z-thickness Z7 and is to thermally couple to both partial IHS 240 and satellite IC die 115. Heat sink 603 is a unitary body having a footprint sized to overlay both partial IHS 240 and satellite IC die 115. In the example shown in FIG. 6C, TIM 661 is in direct contact with partial IHS 240 and in direct contact with planar heat sink 603. TIM 662 is similarly in direct contact with a surface of one or more satellite IC die 115 (since TIM 110 and IHS 240 are only over primary IC die 120), and in direct contact with heat sink 603. For such planar heat sink embodiments, TIM 661 and 662 have different thicknesses Z9 and Z10, respectively, to accommodate any z-height differences resulting from differences in z-height of primary IC 120 and satellite IC die 115, z-thickness of a partial IHS 240, or z-thickness of TIM 110. The difference between BLT Z9 and BLT Z10 may be, for example, substantially equal to a difference between z-height Z1 and z-height Z2 summed with z-height Z3, and further summed with z-height Z5. Even for embodiments with primary IC die 120 and satellite IC die 115 have the same z-heights, the absence of partial IHS 240 (and any TIM 110 therebetween) may induce a z-height difference in a multi-chip package that may be accommodated by varying a bond line thickness of TIM between a planar heat sink surface and the multi-chip package.

Figure 6D:
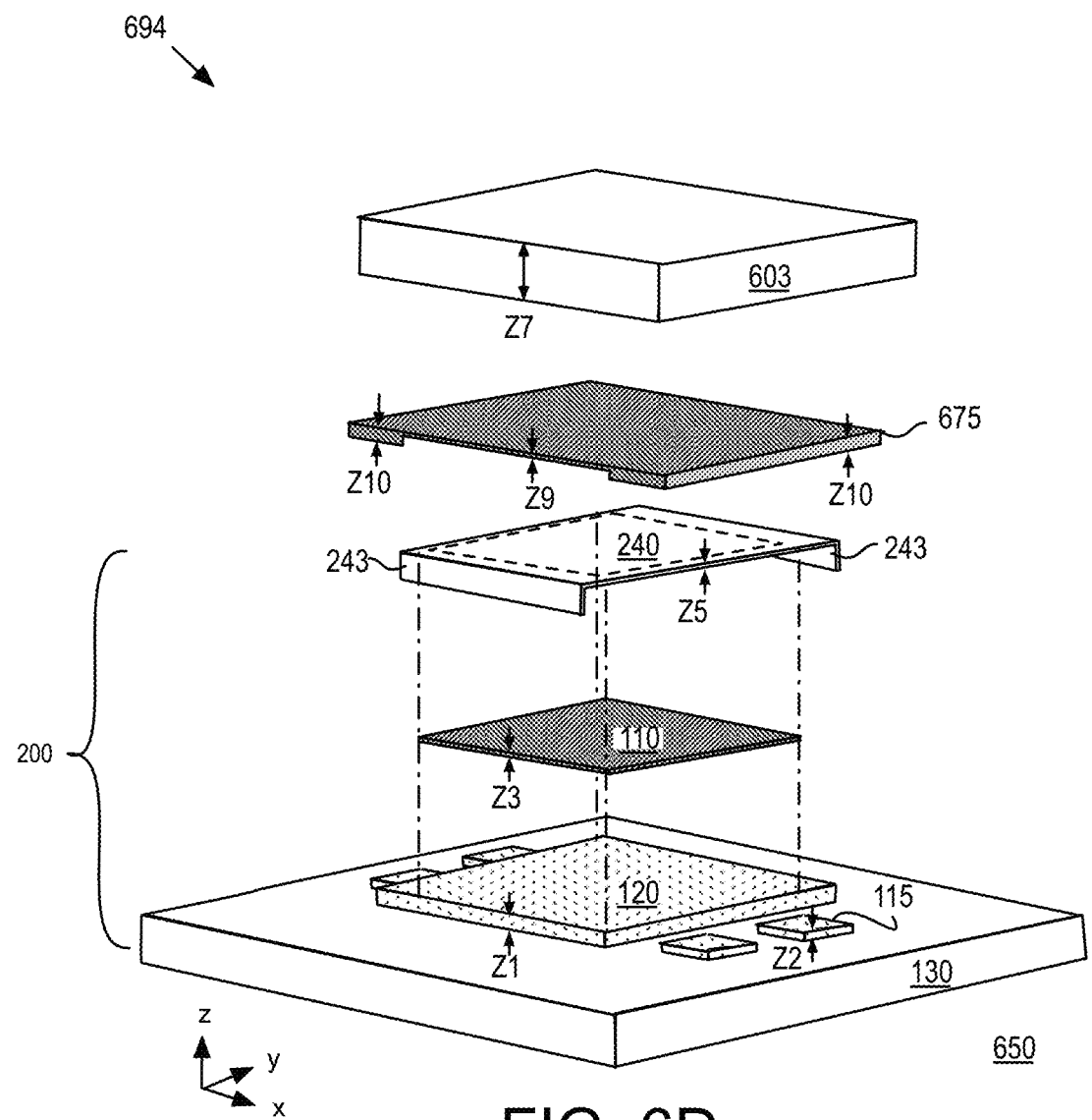

FIG. 6D illustrates a multi-chip package assembly 694 that includes multi-chip package 200, substantially as described elsewhere herein. In alternative embodiments, assembly 694 may include a different multi-chip package, such as, but not limited to, multi-chip package 300 (FIG. 3A), 400 (FIG. 4A), or 500 (FIG. 5A). Multi-chip package assembly 691 may be attached to any host, such as a printed circuit board (PCB) 650, for example through interconnects (e.g., solder features) between a bottom side of package substrate 130 and the multi-chip package assembly host.

In the example shown in FIG. 6D, assembly 694 also includes planar heat sink 603, but only a single TIM 675 is between a planar heat sink surface and a non-planar multi-chip package surface. As shown, TIM 675 has a BLT that varies between thickness Z9 in a portion over partial IHS 240 and thickness Z10 within a portion located over exposed satellite IC die 115. TIM 675 may have any BLT variation needed to accommodate a z-height difference in a multi-chip package 200. The BLT variation may be provided by compressing or extruding a viscous liquid between opposing component surfaces having different z-spacing, or may be provided by stamping, rolling through differential gaps, casting, sintering, processing a preform, or by direct deposition on the dice.

Figure 7:
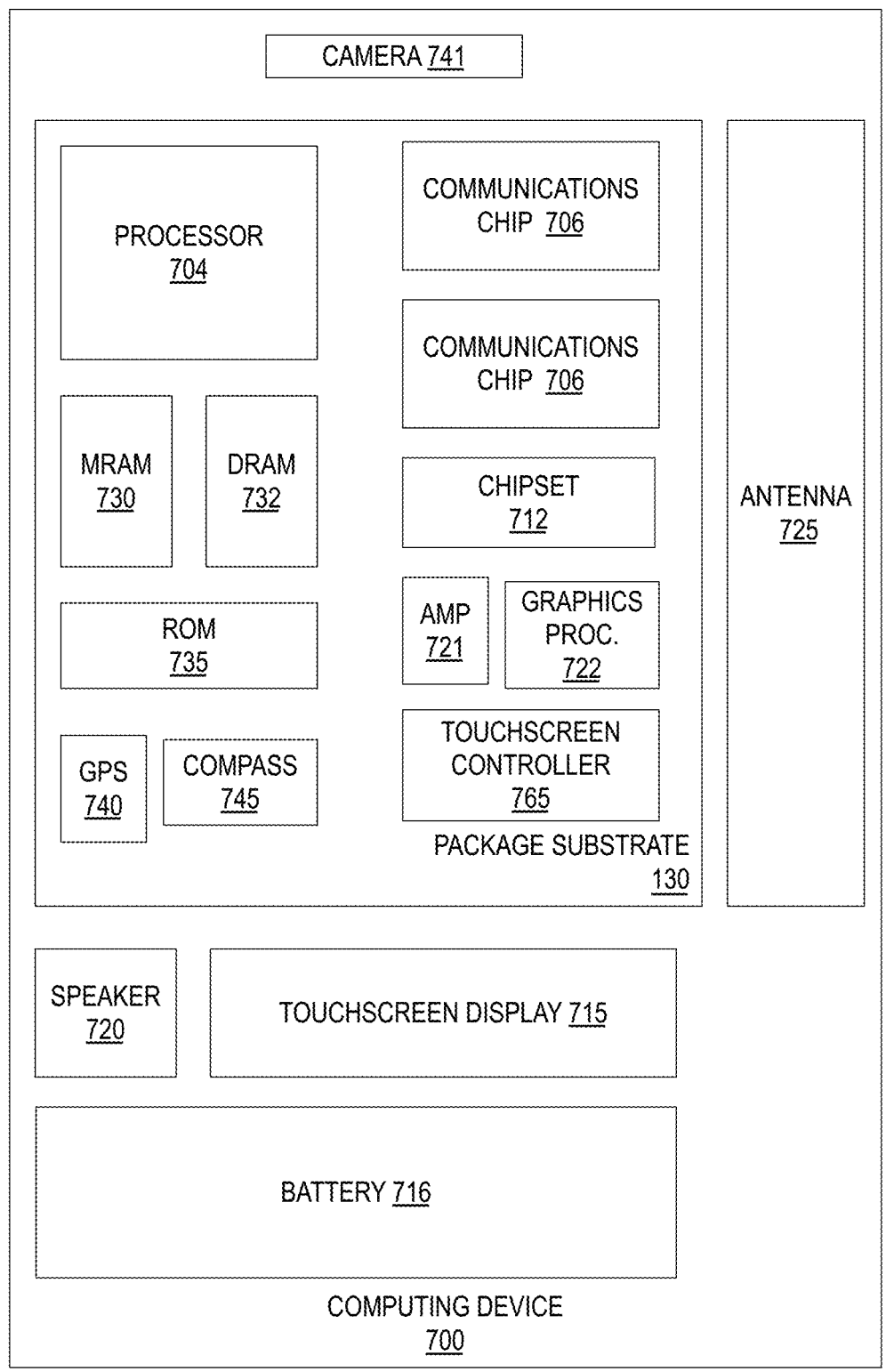
FIG. 7 is a functional block diagram of an electronic computing device, in accordance with some embodiments.

FIG. 7 is a functional block diagram of an electronic computing device 700, in accordance with an embodiment of the present invention. Device 700 further includes a package substrate 130 hosting a number of components, such as, but not limited to, a processor 704 (e.g., an applications processor). Processor 704 may be physically and/or electrically coupled to package substrate 130. In some examples, processor 704 is an integrated circuit die packaged with a partial IHS, which may be further bonded to a heat sink shared with other die packaged on substrate 130. In general, the term "processor" or "microprocessor" may refer to any device or portion of a device that processes electronic data from registers and/or memory to transform that electronic data into other electronic data that may be further stored in registers and/or memory.

In various examples, one or more communication chips 706 may also be physically and/or electrically coupled to package substrate 130. In further implementations, communication chips 706 may be part of processor 704. Depending on its applications, computing device 700 may include other components that may or may not be physically and electrically coupled to package substrate 130. These other components include, but are not limited to, volatile memory (e.g., DRAM 732), non-volatile memory (e.g., ROM 735), flash memory (e.g., NAND or NOR), magnetic memory (MRAM 730), a graphics processor 722, a digital signal processor, a crypto processor, a chipset 712, an antenna 725, touchscreen display 715, touchscreen controller 765, battery 716, audio codec, video codec, power amplifier 721, global positioning system (GPS) device 740, compass 745, accelerometer, gyroscope, speaker 720, camera 741, and mass storage device (such as hard disk drive, solid-state drive (SSD), compact disk (CD), digital versatile disk (DVD), and so forth), or the like. In some exemplary embodiments, at least one of the functional block noted above comprise an IC package assembly including a partial IHS, for example as described elsewhere herein. The IC package assembly may further comprise satellite die directly coupled to a heat sink by a TIM material.

Communication chips 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 606 may implement any of a number of wireless standards or protocols, including but not limited to those described elsewhere herein. As discussed, computing device 700 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

Figure 8:
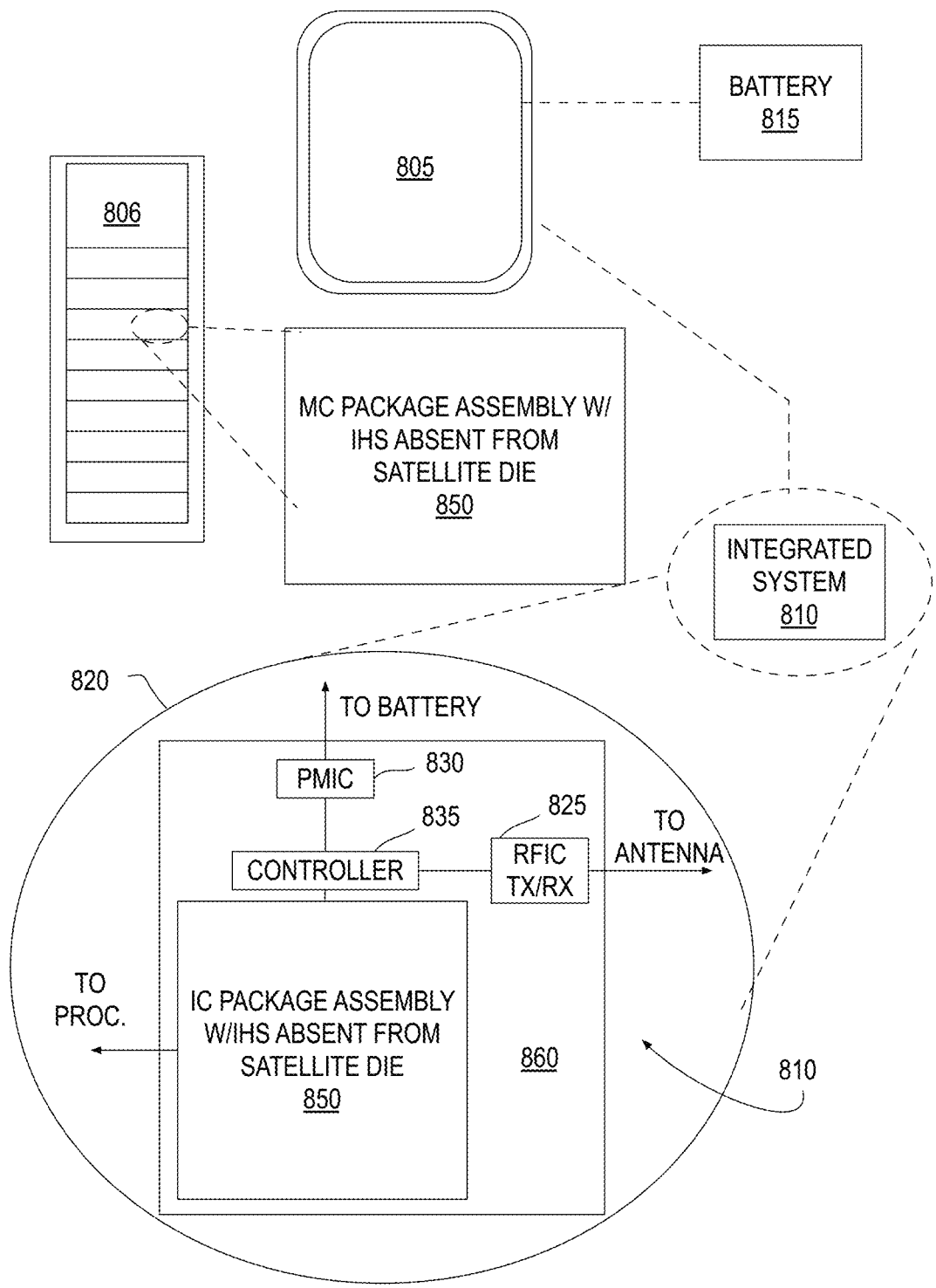
FIG. 8 illustrates a mobile computing platform and a data server machine employing an IC package including a partial IHS, in accordance with some embodiments.

FIG. 8 illustrates a mobile computing platform and a data server machine employing a IC package assembly including a partial IHS, for example as described elsewhere herein. In some further embodiments, a package assembly further includes satellite IC die thermally coupled directly to a package heat sink through one TIM layer while a primary IC die is thermally coupled indirectly to the package heat sink through a partial IHS that is between two TIM layers. Computing device 700 may be found inside platform 805 or server machine 806, for example. The server machine 806 may be any commercial server, for example including any number of high-performance computing platforms disposed within a rack and networked together for electronic data processing, which in the exemplary embodiment includes a multi-chip package that includes a partial IHS, for example as described elsewhere herein. The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level or package-level integrated system 810, and a battery 815.

Whether disposed within the integrated system 810 illustrated in the expanded view 820, or as an expansion card within the server machine 706, a multi-chip package assembly 850 may include a partial IHS, for example as described elsewhere herein. Multi-chip package assembly 750 may be further coupled to a board, a substrate, or an interposer 860 along with, one or more of a power management integrated circuit (PMIC) 830, RF (wireless) integrated circuit (RFIC) 825 including a wideband RF (wireless) transmitter and/or receiver (TX/RX) (e.g., including a digital baseband and an analog front end module further comprises a power amplifier on a transmit path and a low noise amplifier on a receive path), and a controller 835.

Functionally, PMIC 830 may perform battery power regulation, DC-to-DC conversion, etc., and so has an input coupled to battery 815 and with an output providing a current supply to other functional modules. As further illustrated, in the exemplary embodiment, RFIC 825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, a multi-chip microelectronic package, comprises a first IC die with a front side electrically interconnected to a package substrate, a second IC die adjacent to a first edge of the first IC die, wherein the second die has a front side electrically interconnected to the package substrate, and an integrated heat spreader (IHS) over a back side of the first IC die, but not over a back side of the second IC die.

In second examples, for any of the first examples the multi-chip microelectronic package further comprises a first thermal interface material (TIM) between the first IC die and the HIS, and a second TIM over the IHS and over the back side of the IC die.

In third examples, for any of the first through second examples, the multi-chip microelectronic package further comprises a heat sink over the IHS and over the back side of the second IC die, wherein a surface of the heat sink is in contact with the second TIM.

In fourth examples, for any of the second through third examples at least one of the heat sink or the second TIM has a thickness variation that is complementary to a variation in z-height between the IHS and the back side of the second die.

In fifth examples, for any of the first through fourth examples the first IC die has a first thickness, different than that of the second die.

In sixth examples, for any of the first through fifth examples, the multi-chip microelectronic package further comprises a third IC die adjacent to a second edge of the first IC die opposite the first edge. The IHS comprises a first leg adjacent to a third edge intersecting both the first and second edges, the first leg adhered to the package substrate.

In seventh examples, for any of the sixth examples, the IHS comprises a second leg adjacent to a fourth edge, opposite the third edge, and intersecting both the first and second edges, the second leg adhered to the package substrate.

In eighth examples, for any of the first through sixth examples, the IHS comprises a frame surrounding the second IC die and adhered to the package substrate.

In ninth examples, for any of the eighth examples the frame has a thickness different than a thickness of the second IC die.

In tenth examples, for any of the first through ninth examples, the multi-chip microelectronic package further comprises a stiffener adjacent to an edge of the second IC die opposite the first IC die and adhered to the package substrate.

In eleventh examples, for any of the first through tenth examples, the multi-chip microelectronic package further comprises a third IC die adjacent to a second edge of the first IC die opposite the first edge. The IHS comprise a first leg adjacent to a third edge intersecting both the first and second edges, the first leg adhered to the package substrate, a second leg adjacent to a fourth edge, opposite the third edge, and intersecting both the first and second edges, the second leg adhered to the package substrate, a first frame surrounding the second IC die and adhered to the package substrate, and a second frame surrounding the third IC die and adhered to the package substrate.

In twelfth examples, an integrated circuit (IC) assembly comprises a package substrate comprising one or more metallization levels, the package substrate having a first side to electrically couple to a host printed circuit board. The assembly comprises a plurality of IC die, each having a front side electrically interconnected to a second side of the package substrate. The plurality of IC die comprises a primary IC die and a one or more satellite IC die adjacent to one or more edges of the primary IC die. The primary IC die and satellite IC die electrically coupled together through the metallization levels. The assembly comprises an integrated heat spreader (IHS) over a back side of the primary IC die with a first thermal interface material (TIM) therebetween.

The assembly comprises a heat sink over the IHS and over a back side of the satellite IC die with a second TIM therebetween.

In thirteenth examples, for any of the twelfth examples the primary IC die comprises a microprocessor and the satellite IC die comprise at least one of a memory IC, a power management IC, or an RF communication IC.

In fourteenth examples, for any of the twelfth through thirteenth examples the primary IC has a higher peak power dissipation than one or more of the satellite IC die.

In fifteenth examples, for any of the twelfth through fourteenth examples the primary IC has a first footprint over the package substrate that is larger than a second footprint of one or more of the satellite IC die and wherein the primary IC has a different thickness than one or more of the satellite IC die.

In sixteenth examples, for any of the fifteenth examples the IHS comprises a metal sheet having a first dimension no larger than that of the primary die, the metal sheet having first and second bends at opposite ends of the sheet, and the first and second bends adjacent to first and second edges of the primary die and in contact with the package substrate.

In seventeenth examples, for any of the sixteenth examples the satellite IC die are adjacent to third and fourth edges of the primary die.

In eighteenth examples, a computing device, comprises a battery, an antenna, and a multi-chip package coupled to at least one of the battery or antenna. The multi-chip package comprises a first IC die comprising first circuitry electrically interconnected to a package substrate. The package comprises a second IC die comprising second circuitry electrically interconnected to the package substrate, and adjacent to a first edge of the first IC die. The package comprises an integrated heat spreader (IHS) over the first IC die, but not over the second IC die.

In nineteenth examples, for any of the eighteenth examples the first circuitry comprises microprocessor logic circuitry, and wherein the second circuitry comprises at least one of memory, power management or RF communication circuitry.

In twentieth examples, for any of the eighteenth through nineteenth examples a heat sink coupled to the first IC die through the IHS, and coupled directly to the second IC die through a thermal interface material (TIM).

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should therefore be determined with reference to the appended claims, along with the full scope of equivalents to which such claims are entitled.

What is claimed is:

1. A multi-chip microelectronic package, comprising:
   a first IC die with a front side electrically interconnected to a package substrate;
   a second IC die adjacent to a first edge of the first IC die, wherein the second IC die has a front side electrically interconnected to the package substrate;
   a third IC die adjacent to a second edge of the first IC die, opposite the first edge; and
   an integrated heat spreader (IHS) over a back side of the first IC die, but not over a back side of the second or third IC dies, wherein the IHS comprises a first leg adjacent to a third edge of the first IC die, and a second leg adjacent to a fourth edge of the first IC die, opposite the third edge, the first leg and second legs adhered to the package substrate;
   a first thermal interface material (TIM) between the first IC die and the IHS;
   one or more second TIMs in direct contact with the IHS and in direct contact with the back side of at least the second IC die;
   a heat sink over the IHS and over the back side of at least the second IC die, wherein a surface of the heat sink is in direct contact with the one or more second TIMs.

2. The multi-chip microelectronic package of claim 1, wherein at least one of the heat sink or the second TIMs has a thickness variation that is complementary to a variation in z-height between the IHS and the back side of the second die.

3. The multi-chip microelectronic package of claim 1, wherein the first IC die has a first thickness, different than that of the second IC die and the third IC die.

4. The multi-chip microelectronic package of claim 1, wherein the first leg extends a length of the IHS that is approximately equal to a length of the third edge of the IC die.

5. The multi-chip microelectronic package of claim 4, wherein the second leg extends a length of the IHS that is approximately equal to a length of the fourth edge of the IC die.

6. A multi-chip microelectronic package, comprising:
   a first IC die with a front side electrically interconnected to a package substrate;
   a second IC die adjacent to a first edge of the first IC die, wherein the second IC die has a front side electrically interconnected to the package substrate;
   a third IC die adjacent to a second edge of the first IC die, opposite the first edge; and
   an integrated heat spreader (IHS) over a back side of the first IC die, but not over a back side of the second or third IC dies, wherein the IHS comprises a first leg adjacent to a third edge of the first IC die, and a second leg adjacent to a fourth edge of the first IC die, opposite the third edge, the first leg and second legs adhered to the package substrate, wherein the IHS comprises a frame surrounding at least the second IC die, but not covering the back side of the second IC die, and wherein the frame is contiguous with the first and second legs and is adhered to the package substrate.

7. The multi-chip microelectronic package of claim 6, wherein the frame has a z-height less than a z-height of the second IC die.

8. The multi-chip microelectronic package of claim 6, wherein the frame comprises:
   a first frame member surrounding the second IC die, but not covering the back side of the second IC die, wherein the first frame member is contiguous with the first and second legs and is adhered to the package substrate; and
   a second frame member surrounding the third IC die, but not covering the back side of the third IC die, wherein the second frame member is contiguous with the first and second legs and is adhered to the package substrate.

9. An integrated circuit (IC) assembly, comprising:
   a package substrate comprising one or more metallization levels, the package substrate having a first side to electrically couple to a host printed circuit board;
   a plurality of IC die, each having a front side electrically interconnected to a second side of the package substrate, wherein the plurality of IC die comprises a primary IC die and a satellite IC die adjacent to an edge of the primary IC die, the primary IC die and the satellite IC die electrically coupled together through the metallization levels;

an integrated heat spreader (IHS) over a back side of the primary IC die with a first thermal interface material (TIM) therebetween, wherein the IHS comprises a metal sheet having a window over the satellite IC die; and a heat sink over the IHS and over a back side of the satellite IC die, wherein one or more second TIMs are in direct contact with the IHS and a back side of the satellite IC die.

10. The IC assembly of claim 9, wherein the primary IC die comprises a microprocessor and the satellite IC die comprises at least one of a memory IC, a power management IC, or an RF communication IC.

11. The IC assembly of claim 9, wherein the primary IC die has a higher peak power dissipation than the satellite IC die.

12. The IC assembly of claim 11, wherein the primary IC die has a first footprint over the package substrate that is larger than a second footprint of the satellite IC die and wherein the primary IC die has a different thickness than the satellite IC die.

13. The IC assembly of claim 12, wherein the IHS comprises a metal sheet with first and second legs at opposite ends of the sheet, the first and second legs in contact with the package substrate.

14. A computing device, comprising:
 a battery;
 an antenna; and
 the multi-chip microelectronic package of claim 1 coupled to at least one of the battery or antenna.

15. The computing device of claim 14, wherein the first IC die comprises microprocessor logic circuitry, and wherein the at least one of the second or third IC die comprises at least one of memory, power management or RF communication circuitry.

* * * * *